(12) United States Patent
Ishii

(10) Patent No.: US 7,305,934 B2
(45) Date of Patent: Dec. 11, 2007

(54) PLASMA TREATMENT APPARATUS AND PLASMA GENERATION METHOD

(75) Inventor: Nobuo Ishii, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 95 days.

(21) Appl. No.: 10/498,056

(22) PCT Filed: Dec. 18, 2002

(86) PCT No.: PCT/JP02/13246

§ 371 (c)(1),
(2), (4) Date: Jun. 9, 2004

(87) PCT Pub. No.: WO03/052806

PCT Pub. Date: Jun. 26, 2003

(65) Prior Publication Data

US 2005/0082003 A1    Apr. 21, 2005

(30) Foreign Application Priority Data

Dec. 19, 2001   (JP) ............................. 2001-385999

(51) Int. Cl.
*C23C 16/00* (2006.01)
*C23F 1/00* (2006.01)
*H01L 21/306* (2006.01)

(52) U.S. Cl. ................ 118/723 MW; 156/345.41; 156/345.36

(58) Field of Classification Search ....... 118/723 MW; 156/345.36, 345.41
See application file for complete search history.

(56) References Cited

U.S. PATENT DOCUMENTS 3,715,688 A * 2/1973 Woodward ............... 333/1
6,016,766 A * 1/2000 Pirkle et al. ........ 118/723 MW
6,325,018 B1 * 12/2001 Hongoh ............... 118/723 AN
6,476,557 B1 * 11/2002 Leng et al. ............... 313/637
2002/0129904 A1 * 9/2002 Itabashi et al. ........ 156/345.48
2002/0148564 A1 * 10/2002 Ishii et al. ............. 156/345.41

FOREIGN PATENT DOCUMENTS

| EP | 0779644 A |   | 12/1996 |
| JP | 04207703 A | * | 7/1992 |
| JP | 11-040394 A |   | 2/1999 |
| JP | 11-111494 A |   | 4/1999 |
| JP | 2000268996 A | * | 9/2000 |

\* cited by examiner

*Primary Examiner*—Parviz Hasanzadeh
*Assistant Examiner*—Rakesh K. Dhingra
(74) *Attorney, Agent, or Firm*—Crowell & Moring LLP

(57) ABSTRACT

A plasma processing apparatus includes a table (22) on which a processing target (W) is to be placed, a processing vessel (11) where the table is to be accommodated, and a power feed unit (40) for supplying a high-frequency electromagnetic field (F) into the processing vessel. The power supply unit includes at least a cylindrical waveguide (41) for introducing the high-frequency electromagnetic field, and a circular polarization antenna (51) arranged at one end of the cylindrical waveguide to supply the high-frequency electromagnetic field as a rotating electromagnetic field rotating in a plane perpendicular to its traveling direction. Accordingly, there is no need of providing a circular polarization converter for converting the high-frequency electromagnetic field in the cylindrical waveguide into the rotating electromagnetic field. Consequently, it is possible to solve problems caused by the circular polarization converter, stabilize the operation of plasma generation by performing circular polarization feeding, and perform a continuous operation for a long period of time.

12 Claims, 9 Drawing Sheets

PLASMA TREATMENT APPARATUS AND PLASMA GENERATION METHOD

BACKGROUND OF THE INVENTION

The present invention relates to a plasma processing apparatus and plasma generation method.

More specifically, the present invention relates to a plasma processing apparatus and plasma generation method which generate a plasma by an electromagnetic field supplied into a processing vessel using a slot antenna.

The present invention also relates to a plasma processing apparatus and plasma generation method which generate a plasma by using electrons heated by electron-cyclotron-resonance (ECR).

In the manufacture of a semiconductor device or flat panel display, plasma processing apparatuses are used often to perform processes such as formation of an oxide film, crystal growth of a semiconductor layer, etching, and ashing. Among the plasma processing apparatuses, a high-frequency plasma processing apparatus is available which supplies a high-frequency electromagnetic field into a processing vessel by using a slot antenna and ionizes and dissociates a gas in the processing vessel by the operation of the electromagnetic field, thus generating a plasma. The high-frequency plasma processing apparatus can perform a plasma process efficiently since it can generate a low-pressure, high-density plasma.

According to one scheme of the high-frequency plasma processing apparatus, circular polarization feeding is performed through a cylindrical waveguide into a waveguide having a slot antenna. A circularly polarized wave is an electromagnetic wave the electric field vector of which forms a rotating electric field that rotates by one revolution in one period in a plane perpendicular to its traveling direction. When circular polarization feeding is performed, the distribution of the electric field in the waveguide having the slot antenna becomes axi-symmetric about the axis of the traveling direction of the circular polarization on the time average. Hence, a high-frequency electromagnetic field with an axi-symmetric distribution on the time average can be supplied into the processing vessel through the slot antenna, so that a uniform plasma can be generated by the operation of the electromagnetic field.

FIG. 15 shows the conventional arrangement of the power feed unit of a plasma processing apparatus which employs the circular polarization feeding scheme. The power feed unit feeds a circularly polarized wave to a radial line slot antenna (to be abbreviated as RLSA hereinafter) 530 as one type of a slot antenna, and has a high-frequency generator 543 which generates a high-frequency electromagnetic field, a rectangular waveguide 542 with one end connected to the high-frequency generator 543, a rectangular cylindrical converter 592 with one end connected to the other end of the rectangular waveguide 542, a cylindrical waveguide 541 with one end connected to the other end of the rectangular cylindrical converter 592 and the other end that opens to the interior of the RLSA 530, and a circular polarization converter 591 arranged in the cylindrical waveguide 541.

As the circular polarization converter 591, one as shown in FIG. 16A is used which is formed by arranging one or a plurality of pairs of cylindrical metal stubs 591A and 591B on the inner wall of the cylindrical waveguide 541 to oppose each other. The stubs 591A and 591B which form a pair are arranged in directions that form angles of 45° with the main direction of the electric field of the $TE_{11}$-mode high-frequency electromagnetic field input from the rectangular cylindrical converter 592. When a plurality of pairs of stubs 591A and 591B are provided, they are arranged at an angular interval of $\lambda g/4$ (where $\lambda g$ is the tube wavelength of the cylindrical waveguide 541) in the axial direction of the cylindrical waveguide 541, and convert the $TE_{11}$-mode high-frequency electromagnetic field into a rotating electromagnetic field the main direction of the electric field of which rotates about the axis of the cylindrical waveguide 541 as the center.

As the circular polarization converter 591, one as shown in FIG. 16B is used in which one or a plurality of dielectric rods 591C are arranged perpendicularly to the axis of the cylindrical waveguide 541. The dielectric rod 591C is also arranged in the same direction as the main direction of the electric field of the $TE_{11}$-mode high-frequency electromagnetic field input from the rectangular cylindrical converter 592 and at the same angular interval as that of the stubs 591A and 591B in the axial direction of the cylindrical waveguide 541, and converts the $TE_{11}$-mode high-frequency electromagnetic field into a rotating electromagnetic field.

When large power is supplied, in the circular polarization converter 591 which uses the metal stubs 591A and 591B shown in FIG. 16A, the electric field focuses on the distal ends of the stubs 591A and 591B. Then, abnormal discharge tends to occur, and the operation of the plasma processing apparatus after discharge does not stabilize.

In the circular polarization converter 591 which uses the dielectric rod 591C shown in FIG. 16B, as the circular polarization converter 591 tends to be broken by heat generated by the dielectric rod 591C, it cannot withstand a continuous operation for a long period of time.

These problems occur when the circular polarization converter 591 is arranged in the cylindrical waveguide 541. Accordingly, these problem similarly occur in not only the high-frequency plasma processing apparatus described above but also an ECR plasma processing apparatus which feeds circular polarization into a processing vessel.

SUMMARY OF THE INVENTION

The present invention has been made to solve these problems, and has its object to stabilize the operation of a plasma processing apparatus which performs circular polarization feeding.

In order to achieve the above object, a plasma processing apparatus according to the present invention is characterized by comprising a table on which a target object is to be placed, a processing vessel where the table is to be accommodated, and a power feed unit for supplying a high-frequency electromagnetic field into the processing vessel, wherein the power feed unit has at least a cylindrical waveguide which introduces the high-frequency electromagnetic field, and a circular polarization antenna which is arranged at one end of the cylindrical waveguide and supplies the high-frequency electromagnetic field as a rotating electromagnetic field which rotates in a plane perpendicular to a traveling direction of the high-frequency electromagnetic field.

The plasma processing apparatus may further comprises a waveguide which is interposed between the cylindrical waveguide and processing vessel and has two opposing surfaces, wherein the other end of the cylindrical waveguide is open to one of the two opposing surfaces, a slot antenna is formed in the other one of the two surfaces, and the waveguide supplies the high-frequency electromagnetic field introduced from the cylindrical waveguide into the processing vessel through the slot antenna.

Alternatively, the plasma processing apparatus may further comprise a magnetic field generator which forms a magnetic field in the processing vessel, wherein a plasma is generated by using electrons heated by electron-cyclotron-resonance.

In these plasma processing apparatuses, the power feed unit may further have a rectangular waveguide having one side surface connected to one end of the cylindrical waveguide, and the circular polarization antenna may include one or a plurality of slots which open to an interior of the cylindrical waveguide in one side surface of the rectangular waveguide. One side surface of the rectangular waveguide can be an E-surface.

In the above plasma processing apparatus, the power feed unit may further have a rectangular waveguide having a terminal end face connected to one end of the cylindrical waveguide, and the circular polarization antenna may include one or a plurality of slots which open to an interior of the cylindrical waveguide in the terminal end face of the rectangular waveguide.

The slot may include two slots which have different lengths and intersect each other at centers thereof. The slot may include two slots which are arranged away from each other and extend in directions substantially perpendicular to each other.

In the above plasma processing apparatus, the power feed unit may further have at least one coaxial waveguide which includes an inner conductor and an outer conductor disposed around the inner conductor coaxially, and which supplies the high-frequency electromagnetic field to the circular polarization antenna, and the circular polarization antenna may be a patch antenna having a first conductor plate which closes one end of the cylindrical waveguide and is connected to the outer conductor of the coaxial waveguide, and a second conductor plate which opposes the first conductor plate to be separate therefrom in the cylindrical waveguide and is connected to the inner conductor of the coaxial waveguide.

In the above plasma processing apparatus, the slot antenna may include a plurality of cross slots each having two different-length slots that intersect each other at centers thereof.

The above plasma processing apparatus may further comprise a bump which is arranged on the other one of the two surfaces in the waveguide and projects toward the cylindrical waveguide that opens in one of the two surfaces.

A plasma generation method according to the present invention is characterized by supplying a high-frequency electromagnetic field into a cylindrical waveguide as a rotating electromagnetic field which rotates in a plane perpendicular to a traveling direction of the high-frequency electromagnetic field, and supplying the high-frequency electromagnetic field introduced by the cylindrical waveguide into the processing vessel, thereby generating a plasma in the processing vessel.

In the plasma generation method, the high-frequency electromagnetic field introduced by the cylindrical waveguide may be introduced into a waveguide having a slot antenna, and may be supplied into the processing vessel through the slot antenna.

Alternatively, a magnetic field may be further formed in the processing vessel, and a plasma may be generated by using electrons heated by electron-cyclotron-resonance.

DETAILED DESCRIPTION OF THE PREFERRED EMBODIMENTS

The embodiments of the present invention will be described in detail with reference to the drawings.

First Embodiment

Figure 1:
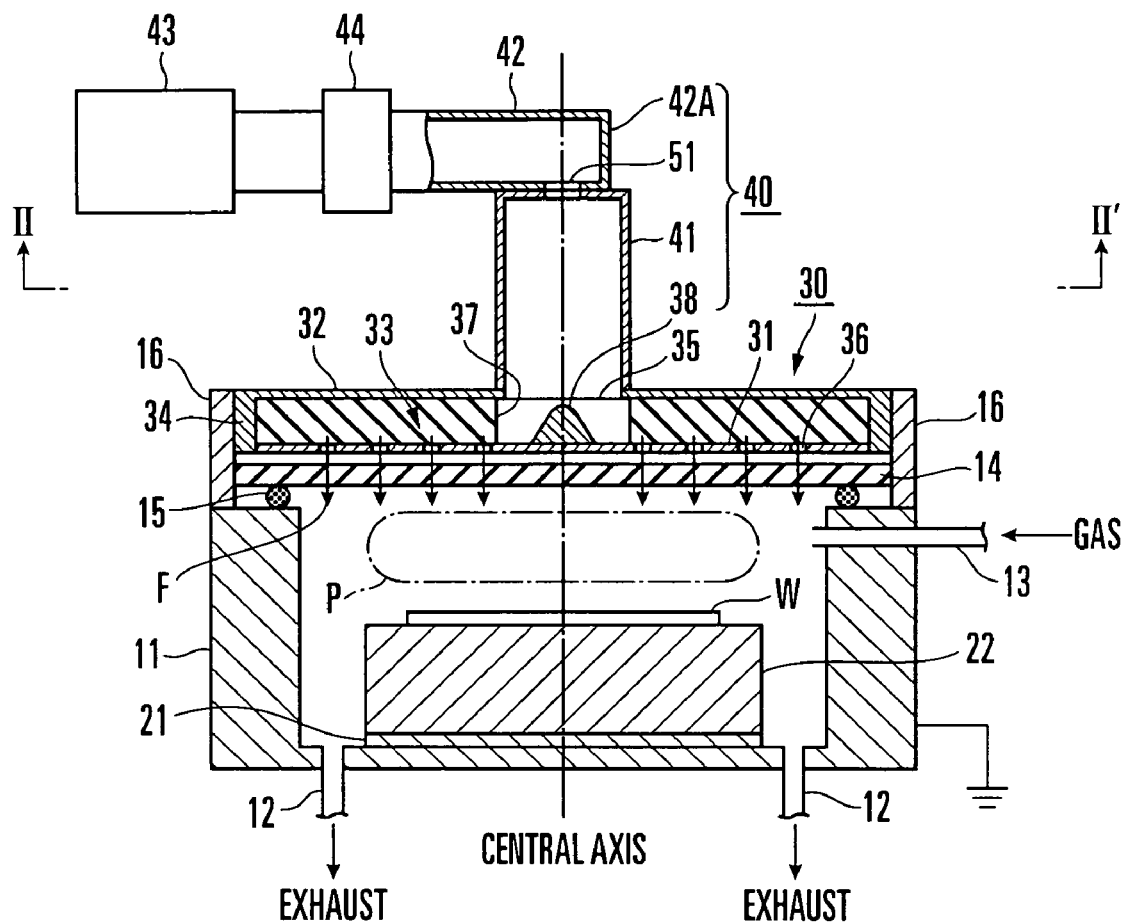
FIG. 1 is a view showing the arrangement of a high-frequency plasma processing apparatus according to the first embodiment of the present invention.

FIG. 1 shows the arrangement of a high-frequency plasma processing apparatus according to the first embodiment of the present invention. This plasma processing apparatus has a processing vessel 11 which accommodates a substrate (target object) W such as a semiconductor or LCD and processes the substrate W with a plasma, an RLSA 30 which supplies a high-frequency electromagnetic field F into the processing vessel 11 and generates a plasma P in the processing vessel 11 by the operation of the high-frequency electromagnetic field F, and a power feed unit 40 which supplies the high-frequency electromagnetic field to the RLSA 30 by circular polarization feeding.

The processing vessel 11 is a bottomed cylinder with an upper opening. A table 22 is fixed to the central portion of the bottom surface of the processing vessel 11 through an insulating plate 21. The substrate W is placed on the upper surface of the table 22.

Exhaust ports 12 for vacuum evacuation are formed in the periphery of the bottom surface of the processing vessel 11. A gas introducing nozzle 13 is arranged in the side wall of the processing vessel 11 to introduce a gas into the processing vessel 11. For example, when the plasma processing apparatus is used as an etching apparatus, a plasma gas such as Ar and an etching gas such as $CF_4$ are introduced into the apparatus through the nozzle 13.

The upper opening of the processing vessel 11 is closed with a dielectric plate 14 so the plasma P will not leak outside while the high-frequency electromagnetic field F is introduced through it. A seal member 15 such as an O-ring is interposed between the upper surface of the side wall of the processing vessel 11 and the dielectric plate 14 to ensure the hermeticity in the processing vessel 11.

The RLSA 30 is disposed on the dielectric plate 14. The outer surfaces of the dielectric plate 14 and RLSA 30 are covered by a shield material 16 annularly arranged on the side wall of the processing vessel 11, so the high-frequency electromagnetic field F will not leak outside.

The RLSA 30 includes two opposing circular conductor plates 31 and 32 which form a radial waveguide 33, and a conductor ring 34 which connects the outer portions of the two conductor plates 31 and 32 to shield them.

A circular opening 35 is formed at the central portion of the conductor plate 32 serving as the upper surface of the radial waveguide 33. The high-frequency electromagnetic field is introduced into the radial waveguide 33 from the power feed unit 40 through the opening 35. A plurality of slots 36 are formed in the conductor plate 31 serving as the lower surface of the radial waveguide 33, to supply the high-frequency electromagnetic field F propagating in the radial waveguide 33 into the processing vessel 11. The plurality of slots 36 form a slot antenna.

A wave delay material 37 made of a dielectric, e.g., alumina, having a relative dielectric constant larger than 1 is arranged in the radial waveguide 33. As the wave delay material 37 decreases a tube wavelength $\lambda g_1$ of the radial waveguide 33, the number of slots 36 to be arranged in the radial direction of the conductor plate 31 can be increased to improve the supply efficiency of the high-frequency electromagnetic field F. The wave delay material 37 is not always necessary, and need not be mounted.

A bump 38 made of a metal or dielectric is arranged at the central portion on the conductor plate 31. The bump 38 is a substantially circular conical member projecting toward the opening 35 of the conductor plate 32. The bump 38 moderates a change in impedance from the feed unit 40 to the radial waveguide 33, so that reflection of the high-frequency electromagnetic field at the connecting portion of the feed unit 40 and radial waveguide 33 can be decreased. Consequently, the high-frequency electromagnetic field can be supplied into the processing vessel 11 efficiently, so that the plasma generation efficiency can be improved.

The power feed unit 40 has a high-frequency generator 43 which generates the high-frequency electromagnetic field, a rectangular waveguide 42 with one end connected to the high-frequency generator 43 and the other end closed, a cylindrical waveguide 41 with one end connected to the other end of the rectangular waveguide 42 through a cross slot 51 and the other end connected to the opening 35 of the RLSA 30, and a load matching unit 44 which is arranged in the rectangular waveguide 42.

The high-frequency generator 43 generates and outputs a high-frequency electromagnetic field having a predetermined frequency within the range of 1 GHz to ten-odd GHz. The high-frequency generator 43 may output high-frequency waves including a microwave band and a frequency band lower than that. In the following description, the high-frequency generator 43 generates a 2.45-GHz high-frequency electromagnetic field.

The load matching unit 44 matches the impedance of the power supply (high-frequency generator 43) side and that of the load (RLSA 30) side. When impedance matching is performed, the high-frequency electromagnetic field can be supplied from the high-frequency generator 43 to the RLSA 30 efficiently. In place of arranging the load matching unit 44 in the rectangular waveguide 42, it may be arranged in the cylindrical waveguide 41.

Figure 2A:
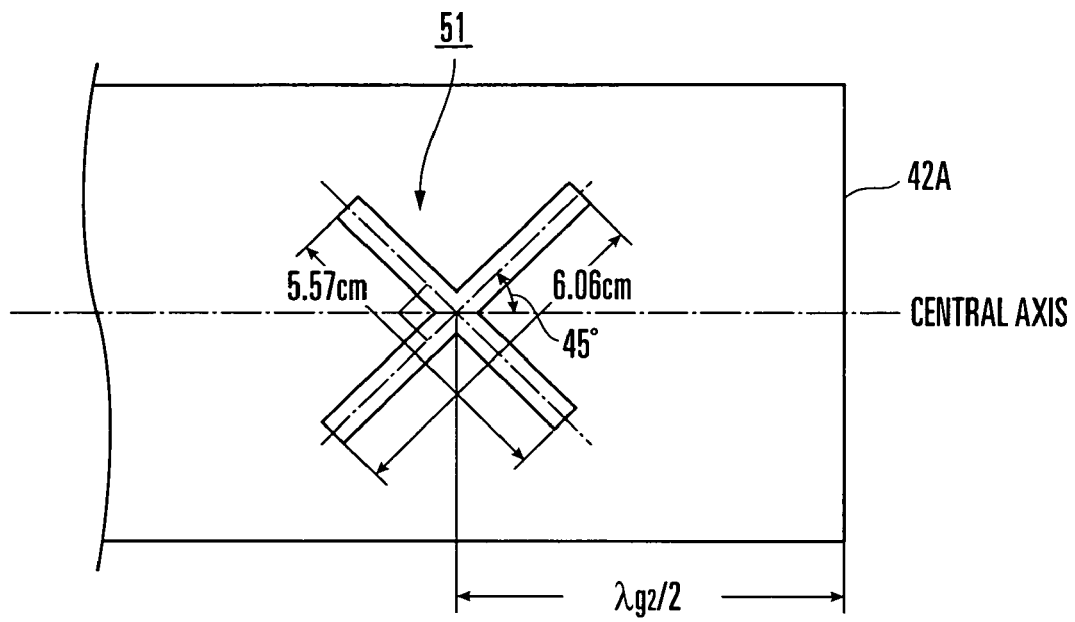
FIGS. 2A and 2B are plan views showing arrangements of the cross slot of a power feed unit.
Figure 2B:
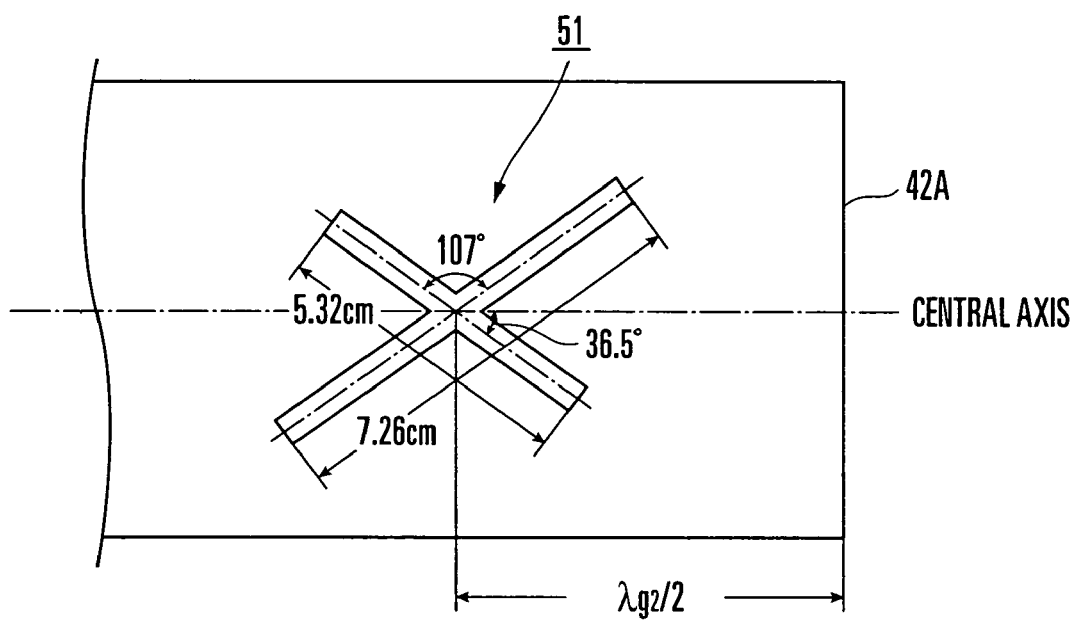

The cross slot 51 serves as a circular polarization antenna which supplies the high-frequency electromagnetic field to the cylindrical waveguide 41 as circular polarization, i.e., as a rotating electromagnetic field which rotates by one revolution in one period in a plane perpendicular to its traveling direction. The arrangement of the cross slot 51 will be described in detail with reference to FIGS. 1, 2A, and 2B. FIGS. 2A and 2B are plan views showing arrangements of the cross slot 51, and are obtained when an E-surface of the rectangular waveguide 42 is seen from the direction of the lines II-II'. The E-surface refers to that surface of the rectangular waveguide 42 on and from which a virtual electric power line is input and output.

The cross slot 51 shown in FIG. 2A is formed at that portion of the E-surface of the rectangular waveguide 42 where it is connected to the cylindrical waveguide 41. In the cross slot 51, two slots having different lengths intersect at their centers. The centers of the two slots, i.e., the center of the cross slot 51 is located on substantially the central axis of the E-surface. A terminal end 42A of the rectangular waveguide 42 is closed with a metal. The center of the cross slot 51 is arranged at a position away from the terminal end 42A by substantially $\lambda g_2/2$ where $\lambda g_2$ is the tube wavelength in the rectangular waveguide 42. When the cross slot 51 is arranged at this position, the amplitude of the emission electric field obtained with the cross slot 51 can be maximized.

The lengths and angles of the two slots which form the cross slot 51 are adjusted such that the frequency characteristics of the two slots with respect to 2.45 GHz relatively differ by about 55° to 70° and that the amplitudes of the emission electric fields obtained by the respective slots are equal.

More specifically, the lengths of the two slots are set to 5.57 cm and 6.06 cm, respectively. The two slots can be arranged such that they intersect each other at substantially a right angle and tilt by substantially 45° with respect to the central axis of the E-surface of the rectangular waveguide 45.

Alternatively, as shown in FIG. 2B, the lengths of the two slots may be set to 5.32 cm and 7.26 cm, respectively. The two slots can be arranged such that they intersect each other at substantially 107° and tilt with respect to the central axis of the E-surface of the rectangular waveguide 42 by substantially 36.5°.

When such a cross slot 51 is formed in the E-surface of the rectangular waveguide 42, $TE_{11}$-mode circular polarization the axial ratio of which is very close to 1 with respect to the frequency of 2.45 GHz can be obtained. The axial ratio refers to the ratio of the maximum value to the minimum value of the field strength distribution (time average) on a circular section of circular polarization.

The operation of the plasma processing apparatus shown in FIG. 1 will be described.

The high-frequency electromagnetic field generated by the high-frequency generator 43 propagates through the rectangular waveguide 42 in the $TE_{10}$ mode, and is emitted into the cylindrical waveguide 41 through the cross slot 51 formed in the E-surface. The high-frequency electromagnetic field emitted into the cylindrical waveguide 41 forms $TE_{11}$-mode circular polarization, thus forming a rotating electromagnetic field. The rotating electromagnetic field is introduced from the cylindrical waveguide 41 into the RLSA 30 through the opening 35, to feed circular polarization to the RLSA 30.

The high-frequency electromagnetic field introduced into the RLSA 30 is supplied from the plurality of slots 36 formed in the RLSA 30 into the processing vessel 11 through the dielectric plate 14. The high-frequency electromagnetic field supplied into the processing vessel 11 ionizes the plasma gas introduced into the processing vessel 11 through the gas introducing nozzle 13 to generate the plasma P, to process the substrate 4.

In this manner, in the plasma processing apparatus shown in FIG. 1, the high-frequency electromagnetic field can be supplied into the cylindrical waveguide 41 as a rotating electromagnetic field through the cross slot 51 formed in the E-surface of the rectangular waveguide 42. The circular polarization converter 591 which is conventionally used to convert the high-frequency electromagnetic field in the cylindrical waveguide 541 into the rotating electromagnetic field becomes unnecessary. Hence, the problems caused by the circular polarization converter 591 can be solved. The operation of generating the plasma P by performing circular polarization feeding can be stabilized. Also, a continuous operation for a long period of time is enabled.

Not only the circular polarization converter 591 but also the rectangular cylindrical converter 592 becomes unnecessary. Thus, the number of components can be decreased, and the manufacturing cost of the plasma processing apparatus can accordingly be decreased.

Second Embodiment

Figure 3:
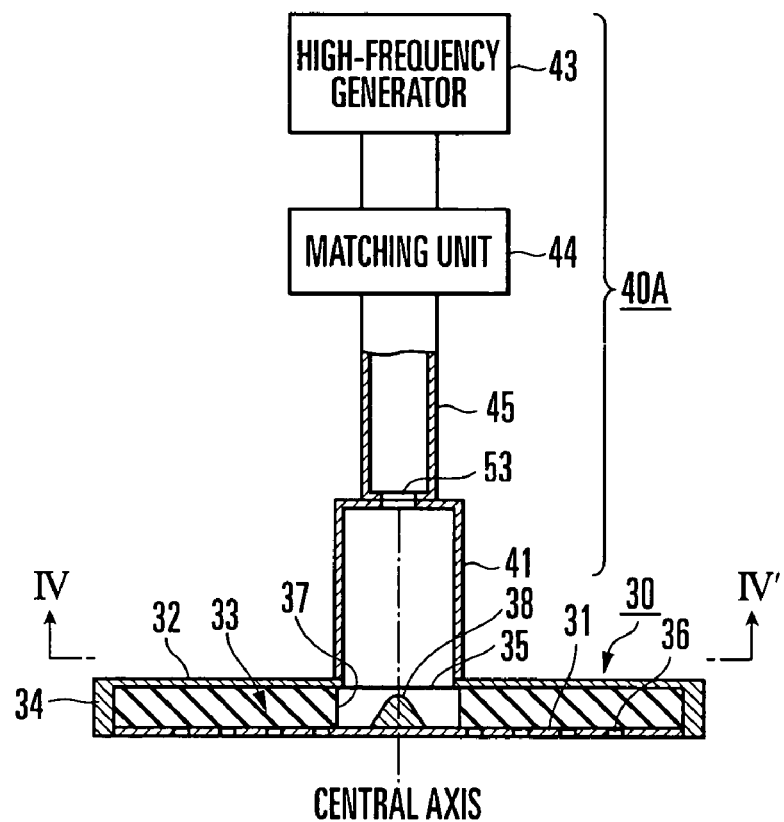
FIG. 3 is a view showing the arrangement of part of a high-frequency plasma processing apparatus according to the second embodiment of the present invention.

FIG. 3 is a view showing the arrangement of part of a high-frequency plasma processing apparatus according to the second embodiment of the present invention. FIG. 3 shows the arrangement of a power feed unit. The same or equivalent portions as in FIG. 1 are denoted by the same reference numerals, and a description thereof will be omitted when appropriate.

In the power feed unit 40 shown in FIG. 1, the cross slot 51 is formed in the E-surface of the rectangular waveguide 42. In a power feed unit 40A shown in FIG. 3, a cross slot 53 is formed in the terminal end face of a rectangular waveguide 45. The first and second embodiments are different from each other in this respect. The second embodiment will be described mainly on this difference with reference to FIGS. 3 and 4.

Figure 4:
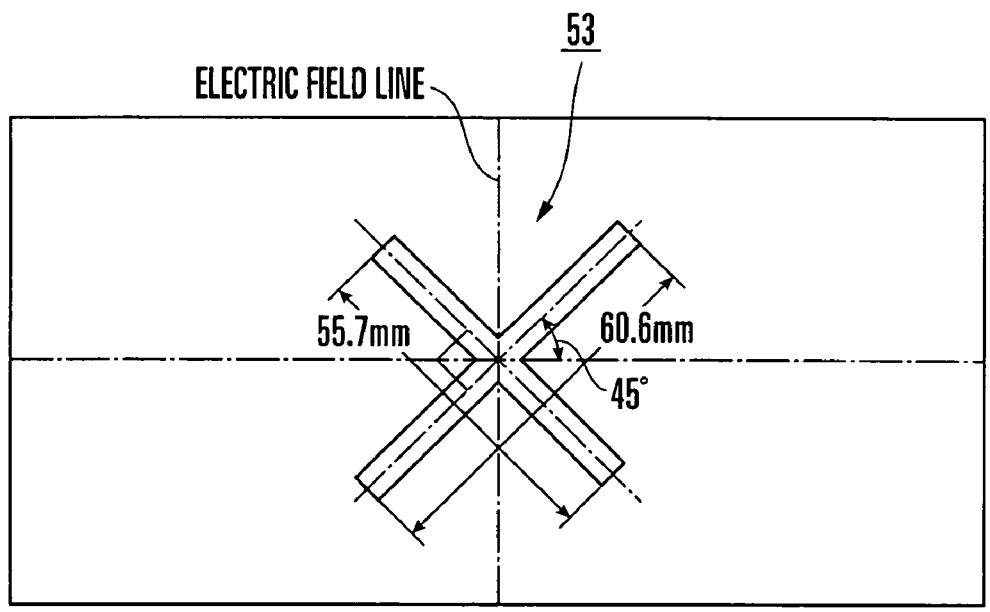
FIG. 4 is a plan view showing an arrangement of the cross slot of a power feed unit.

FIG. 4 is a plan view showing an arrangement of the cross slot 53 formed in the terminal end face of the rectangular waveguide 45 when the terminal end face of the rectangular waveguide 45 is seen from the direction of the line IV-IV'. The arrangement of the cross slot 53 is almost the same as that of the cross slot 51 formed in the E-surface. More specifically, the cross slot 53 includes two different-length slots that intersect each other at their centers. The two slots are adjusted such that their frequency characteristics with respect to 2.45 GHz relative differ by about 55° to 70° and that the amplitudes of the emission electric fields obtained by the respective slots are equal. More specifically, the lengths of the two slots are set to 5.57 cm and 6.06 cm, respectively. The two slots can be arranged such that they intersect each other at substantially a right angle and tilt by substantially 45° with respect to a virtual field line generated at the central portion of the rectangular waveguide 45. The center of the cross slot 53 is arranged at substantially the center of the terminal end face of the rectangular waveguide 45.

When such a cross slot 53 is formed in the terminal end face of the rectangular waveguide 45, $TE_{11}$-mode circular polarization the axial ratio of which is very close to 1 with respect to the frequency of 2.45 GHz can be obtained. In other words, the cross slot 53 also serves as the circular polarization antenna.

Therefore, the power feed unit 40A shown in FIG. 3 can supply a high-frequency electromagnetic field into a cylindrical waveguide 41 as a rotary magnetic field through the cross slot 53 formed in the terminal end face of the rectangular waveguide 45. The circular polarization converter 591 becomes unnecessary in the same manner as in the power feed unit 40 shown in FIG. 1. Consequently, the operation of generating a plasma P by performing circular polarization feeding can be stabilized. Also, a continuous operation for a long period of time is enabled.

Figure 5:
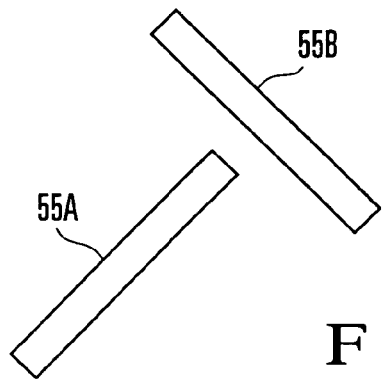
FIG. 5 is a view showing the arrangement of an inverted-V-shaped slot that can replace a cross slot.

In the first and second embodiments described above, the cross slots 51 and 53 are used, respectively. Alternatively, a so-called inverted-V-shaped slot as shown in FIG. 5, in which two slots 55A and 55B substantially perpendicular to each other are arranged separate from each other, may be used to feed circular polarization to the cylindrical waveguide 41. The inverted-V-shaped slot suffices as far as the extension line of one slot 55A intersects the other slot 55B on the slot 55B or on its extension line.

Figure 6A:
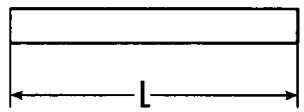
FIGS. 6A and 6B are plan views each showing the shape of a slot.
Figure 6B:

The planar shape of each of the slots that form the cross slot 51 or 53 or the inverted-V-shaped slot can be a rectangle as shown in FIG. 6A, or a shape obtained by connecting the two ends of two parallel straight lines with curves such as arcs, as shown in FIG. 6B. A length L of the slot corresponds to the length of the long side of the rectangle in FIG. 6A, and the length of each of the two parallel straight lines in FIG. 6B.

Third Embodiment

Figure 7:
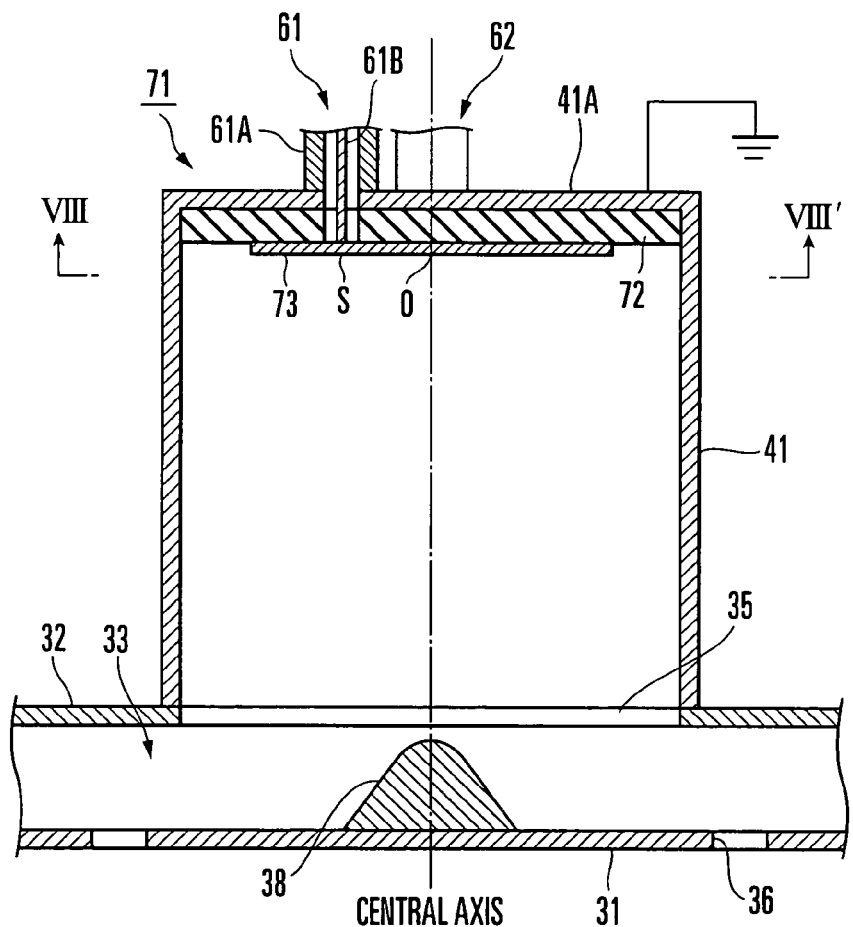
FIG. 7 is a view showing the arrangement of part of a high-frequency plasma processing apparatus according to the third embodiment of the present invention.

FIG. 7 is a view showing the arrangement of part of a high-frequency plasma processing apparatus according to the third embodiment of the present invention. FIG. 7 shows the arrangement of a power feed unit. The same or identical portions as in FIG. 1 are denoted by the same reference numerals, and a description thereof will be omitted when appropriate.

The power feed unit shown in FIG. 7 supplies a high-frequency electromagnetic field into a cylindrical waveguide 41 as a rotating electromagnetic field by using a patch antenna 71 which operates as a circular polarization antenna. The patch antenna 71 includes a grounded circular conductor plate (first conductor plate) 41A which closes one end of the cylindrical waveguide 41, a dielectric plate 72 arranged on the lower surface of the circular conductor plate 41A, and a conductor plate (second conductor plate) 73 which opposes the circular conductor plate 41A through the dielectric plate 72. In the following description, in order to avoid mixing up of the circular conductor plate 41A and conductor plate 73, the former will be called the ground plate 41A and the latter will be called the resonator 73.

The ground plate 41A is connected to outer conductors 61A and 62A (the outer conductor 62A is not shown) of two coaxial waveguides 61 and 62. The resonator 73 is connected to inner conductors 61B and 62B (the inner conductor 62B is not shown) of the two coaxial waveguides 61 and 62. To fix the center of the resonator 73 at ground potential, the center of the resonator 73 may be connected to the ground plate 41A through a conductor column. The ground plate 41A, resonator 73, and conductor column are made of copper, aluminum, or the like, and the dielectric plate 72 is made of a ceramic material or the like.

Figure 8:
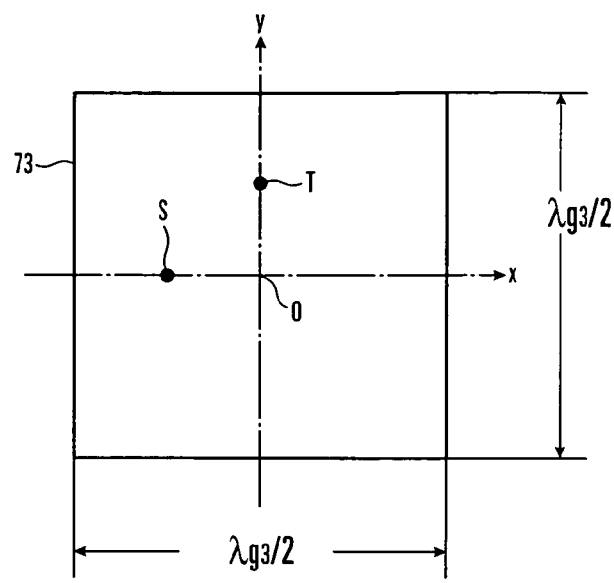
FIG. 8 is a plan view of a resonator for the patch antenna of a power feed unit.

FIG. 8 is a plan view showing the resonator 73 when seen from the direction of the VIII-VIII' line. The planar shape of the resonator 73 is a square with substantially $\lambda g_3/2$-length sides where $\lambda g_3$ is the wavelength of a high-frequency electromagnetic field propagating between the ground plate 41A and resonator 73.

When the center of the resonator 73 is defined as an origin O of the coordinate system and the x- and y-axes are set parallel to the respective sides of the resonator 73, the inner conductors 61B and 62B of the two coaxial waveguides 61 and 62 are connected to two points on the x- and y-axes which are substantially at the equal distances from the origin O on the resonator 73. The two points will be referred to as power feed points S and T.

When high-frequency electromagnetic fields which have the same amplitudes but phases different from each other by 90° are supplied to the patch antenna 71 with the above arrangement from the two coaxial waveguides 61 and 62, a $TE_{11}$-mode rotating electromagnetic field can be generated in the cylindrical waveguide 41. The principle for this is as follows.

As the length of the resonator 73 in the x-axis direction is $\lambda g_3/2$, the current supplied to the power feed point S from one coaxial waveguide 61 resonates in the x-axis direction, and the two sides of the resonator 73 which are parallel to the y-axis emit a linearly polarized wave parallel to the x-axis. As the length of the resonator 73 in the y-axis is also $\lambda g_3/2$, the current supplied to the power feed point T from the other coaxial waveguide 62 resonates in the y-axis direction, and the two sides of the resonator 73 which are parallel to the x-axis emit a linearly polarized wave parallel to the y-axis. As the power feed phases of the two coaxial waveguides 61 and 62 differ from each other by 90°, the phases of the two emitted linearly polarized waves also differ from each other by 90°. In addition, as the two linearly polarized waves have the same amplitude and are orthogonal spatially, they form a circularly polarized wave to eventually generate a rotating electromagnetic field in the cylindrical waveguide 41.

In this manner, the power feed unit shown in FIG. 7 can supply a high-frequency electromagnetic field into the cylindrical waveguide 41 as a rotating electromagnetic field through the patch antenna 71. Therefore, the circular polarization converter 591 becomes unnecessary in the same manner as in the power feed unit 40 shown in FIG. 1. Consequently, the operation of generating a plasma P by performing circular polarization feeding can be stabilized. Also, a continuous operation for a long period of time is enabled.

To make the difference between the power feed phases to the patch antenna 71 to 90°, a phase shifter may be used. Alternatively, high-frequency electromagnetic fields having the same phases may be supplied to two coaxial waveguides the electrical lengths of which differ from each other by 90°.

The planar shape of the resonator 73 of the patch antenna 71 may be a square shown in FIG. 8, or a 90°-rotationally symmetric shape (a shape on which the resonator 73 overlaps when it is rotated through 90° within its plane) such as a circle. In the case of a circle, its diameter may be set to substantially $1.17 \times \lambda g_3/2$. The planar shape of the resonator 73 can be one, e.g., a rectangle, the lengths of which in two orthogonal directions when seen from the center differ. In this case, the difference between the power feed phases at the two power feed points S and T is not set to 90° but is adjusted in accordance with the lengths in the two directions described above.

Fourth Embodiment

Figure 9:
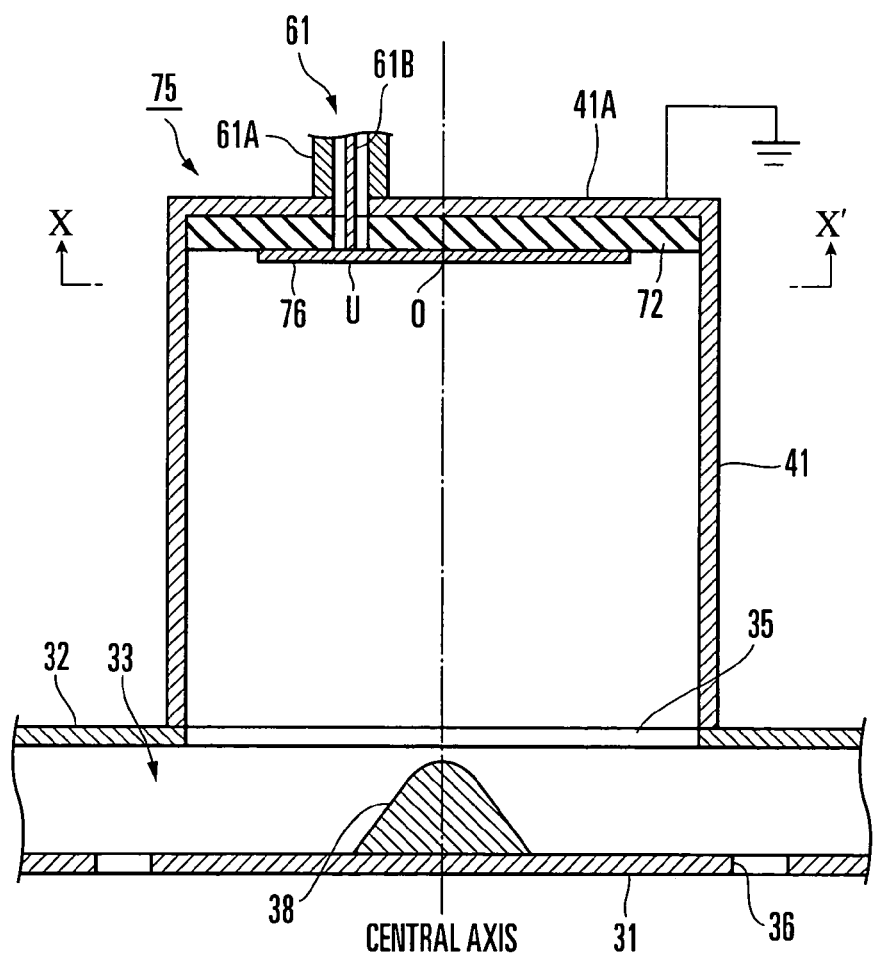
FIG. 9 is a view showing the arrangement of part of a high-frequency plasma processing apparatus according to the fourth embodiment of the present invention.

FIG. 9 is a view showing the arrangement of part of a high-frequency plasma processing apparatus according to the fourth embodiment of the present invention. FIG. 9 shows the arrangement of a power feed unit. The same or identical portions as in FIGS. 1 and 7 are denoted by the same reference numerals, and a description thereof will be omitted when appropriate.

The power feed unit shown in FIG. 7 employs the two-point-feeding patch antenna 71 which uses the two coaxial waveguides 61 and 62. The power feed unit shown in FIG. 9 employs a one-point-feeding patch antenna 75 which uses one coaxial waveguide 61. The fourth embodiment is different from the third embodiment in this respect. The fourth embodiment will be described mainly on this difference.

The patch antenna 75 includes a grounded circular conductor plate 41A which closes one end of a cylindrical waveguide 41, a dielectric plate 72 arranged on the lower surface of the circular conductor plate 41A, and a conductor plate (second conductor plate) 76 which opposes the circular conductor plate 41A through the dielectric plate 72. In the following description, to avoid mixing up of the circular conductor plate 41A and conductor plate 76, the former will be called the ground plate 41A and the latter will be called the resonator 76. The ground plate 41A is connected to an outer conductor 61A of the coaxial waveguide 61. The resonator 76 is connected to an inner conductor 61B of the coaxial waveguide 61.

Figure 10:
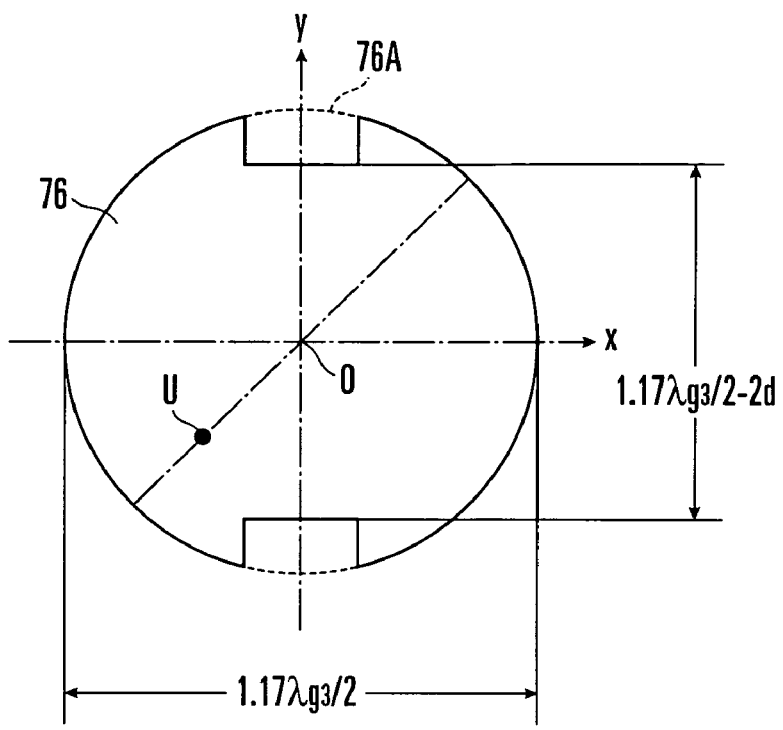
FIG. 10 is a plan view of a resonator for the patch antenna of a power feed unit.

FIG. 10 is a plan view showing the resonator 76 when seen from the direction of the line X-X'. As shown in FIG. 10, the planar shape of the resonator 76 is the one obtained by notching part of the peripheral region of a circle 76A. More specifically, the shape of the resonator 76 is obtained by rectangularly notching two regions near where the perimeter of the circle intersects the y-axis. The notching area may be approximately 3% the area of the circle 76A. In this embodiment, the length of the resonator 76 in the x-axis direction is substantially $1.17 \times \lambda g_3/2$, and the length of the resonator 76 in the y-axis direction is substantially $1.17 \times \lambda g_3/2 - 2d$.

The inner conductor 61B of the coaxial waveguide 61 is connected to one point on a straight line that intersects the x- and y-axes at angles of 45°. This point will be referred to as a power feed point U.

The current supplied from the coaxial waveguide 61 to the power feed point U of the resonator 76 flows in the x- and y-axis directions independently of each other. At this time, as the length in the y-axis direction is smaller than $1.17 \times \lambda g_3/2$ by 2d, the dielectric constant when seen from the electromagnetic field increases, and the phase of the current flowing in the y-axis direction delays. If the value of 2d and the lengths of the notched portions are set such that this phase delay becomes 90°, the patch antenna 75 emits circular polarization, and a $TE_{11}$-mode rotating electromagnetic field is generated in the cylindrical waveguide 41.

In this manner, the power feed unit shown in FIG. 9 can supply the high-frequency electromagnetic field into the cylindrical waveguide 41 as a rotating electromagnetic field through the patch antenna 75. Accordingly, the circular polarization converter 591 becomes unnecessary in the same manner as in the power feed unit shown in FIG. 1 or 7. Consequently, the operation of generating a plasma P by performing circular polarization feeding can be stabilized. Also, a continuous operation for a long period of time is enabled.

The planar shape of the resonator 76 is not limited to the shape shown in FIG. 10, but it suffices as far as at least its lengths in two orthogonal directions when seen from the center of the resonator 76 differ from each other. Thus, the planar shape of the resonator 76 may be an ellipse, or a rectangle each long side of which has a length of approximately $\lambda g_3/2$ and each short side of which has a length of approximately less than $\lambda g_3/2$.

Fifth Embodiment

Figure 11:
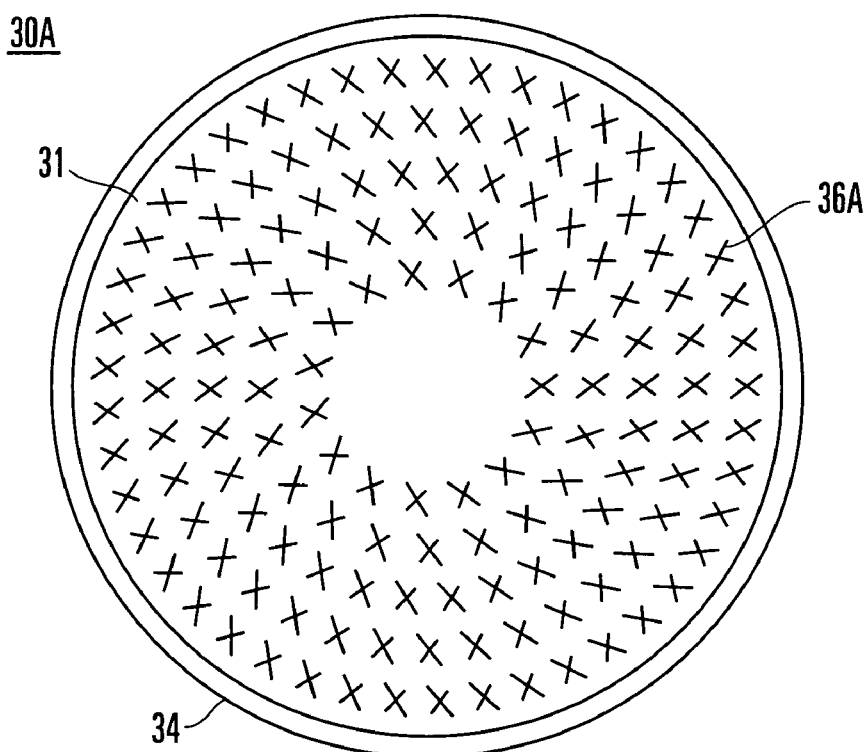
FIG. 11 is a view showing the arrangement of part of a high-frequency plasma processing apparatus according to the fifth embodiment of the present invention.

FIG. 11 is a view showing the arrangement of part of a high-frequency plasma processing apparatus according to the fifth embodiment of the present invention. FIG. 11 shows the arrangement of the slots of an RLSA. The same or identical portions as in FIG. 1 are denoted by the same reference numerals, and a description thereof will be omitted when appropriate.

In the first to fourth embodiments described above, the RLSA 30 having a slot antenna to supply the high-frequency electromagnetic field F into the processing vessel 11 is used. Alternatively, an RLSA 30A having a slot antenna including cross slots 36A may be used. The arrangement of the cross slots 36A can be the same as that of the cross slot 51 used in the power feed unit 40 shown in FIGS. 1, 2A, and 2B. More specifically, each cross slot 36A includes two different-length slots that intersect each other at their centers. Due to the operation of a wave delay material 37, a tube wavelength $\lambda g_1$ of the RLSA 30A is smaller than a tube wavelength $\lambda g_2$ of a rectangular waveguide 42, and accordingly the size of the cross slot 36A is smaller.

In the RLSA 30A shown in FIG. 11, a plurality of cross slots 36A each having the arrangement as described above are concentrically arranged on a conductor plate 31 which forms a slot surface. The interval between the concentric circles (the difference in diameter between inner and outer circles) can be equal to the tube wavelength $\lambda g_2$ of the RLSA 30A, but is not limited to this. The plurality of cross slots 36A may be arranged on swirl lines. The interval between the swirl lines (the shift of the cross slots 36A in the radial direction when they rotate by one turn on the swirl lines) is the same as the interval between the concentric circles described above.

According to the characteristic feature of the cross slot 36A, circular polarization can be obtained at a point where the two slots that form the cross slot 36A intersect, so that circular polarization as designed can be obtained easily. When the RLSA 30A in which the plurality of such cross slots 36A are arranged is used, a circularly polarized wave can be emitted as designed into a processing vessel 11. As a result, the field strength distribution in the processing vessel 11 can be axi-symmetric on a time average, and a uniform plasma P can be generated by the operation of the electromagnetic field in the processing vessel 11.

Figure 12:
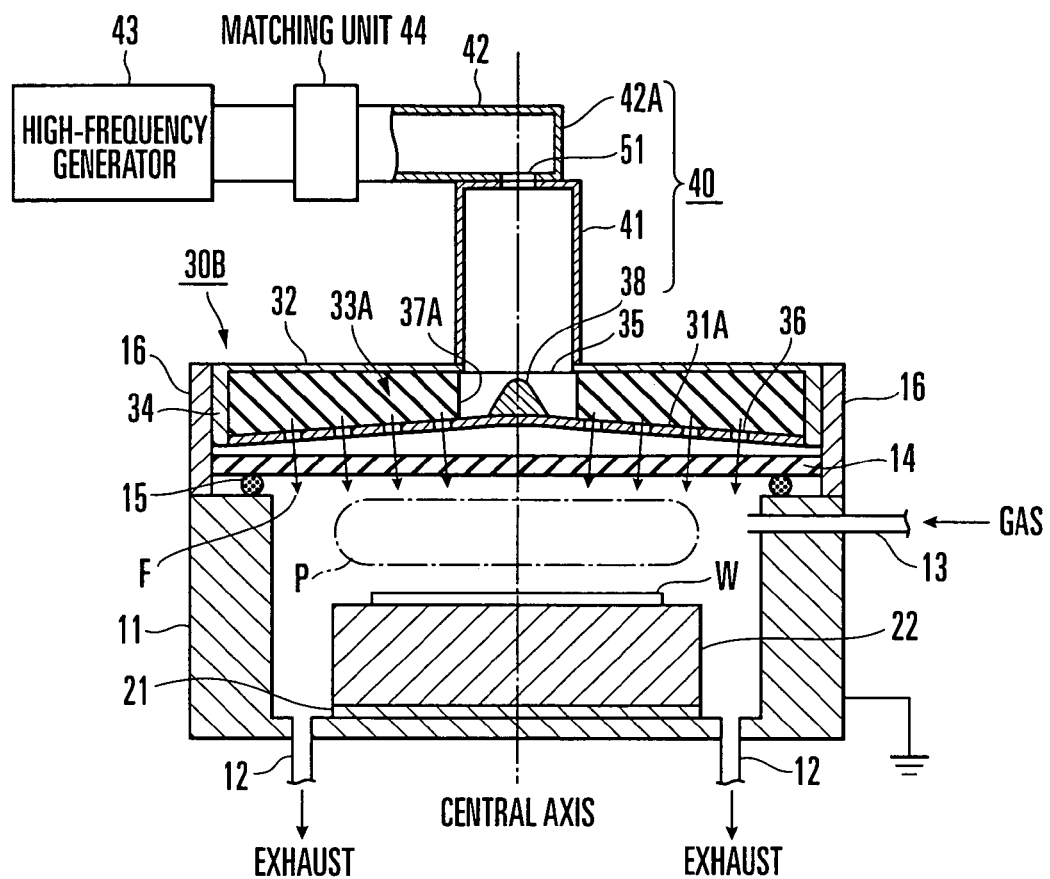
FIG. 12 is a sectional view showing the arrangement of a radial line slot antenna which can be used in the present invention.
Figure 13A:
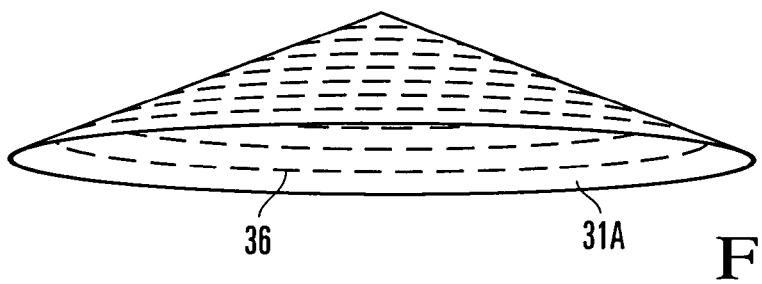
FIGS. 13A and 13B are perspective views showing arrangements of the slot surface of the radial line slot antenna shown in FIG. 12.

In the RLSA 30 or 30A, the conductor plate 31 which forms the slot surface is a flat plate. Alternatively, as in an RLSA 30B shown in FIGS. 12 and 13A, a conductor plate 31A which forms the slot surface may be a circular cone. A high-frequency electromagnetic field F emitted (or leaking) from the circular conical slot surface becomes incident obliquely on a plasma surface defined by a flat-plate-like dielectric plate 14. The absorption efficiency of the high-frequency electromagnetic field F generated by the plasma P improves accordingly. Thus, a standing wave present between the antenna surface and plasma surface decreases to improve the uniformity of the plasma distribution.

Figure 13B:
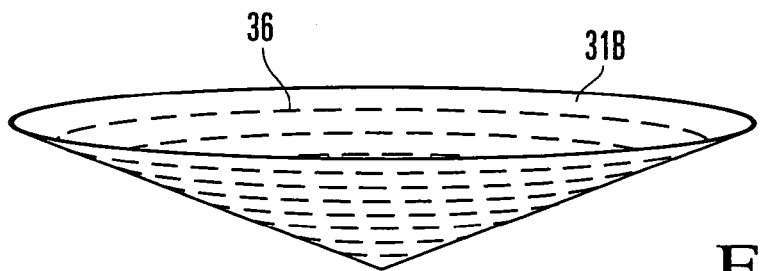

The conductor plate 31A which forms the antenna surface of the RLSA 30B is an upwardly projecting circular cone. Alternatively, a conductor plate 31B which forms a downwardly projecting circular cone, as shown in FIG. 13B, can be used. The conductor plates 31A and 31B can have projecting shapes other than circular cones.

Sixth Embodiment

Figure 14:
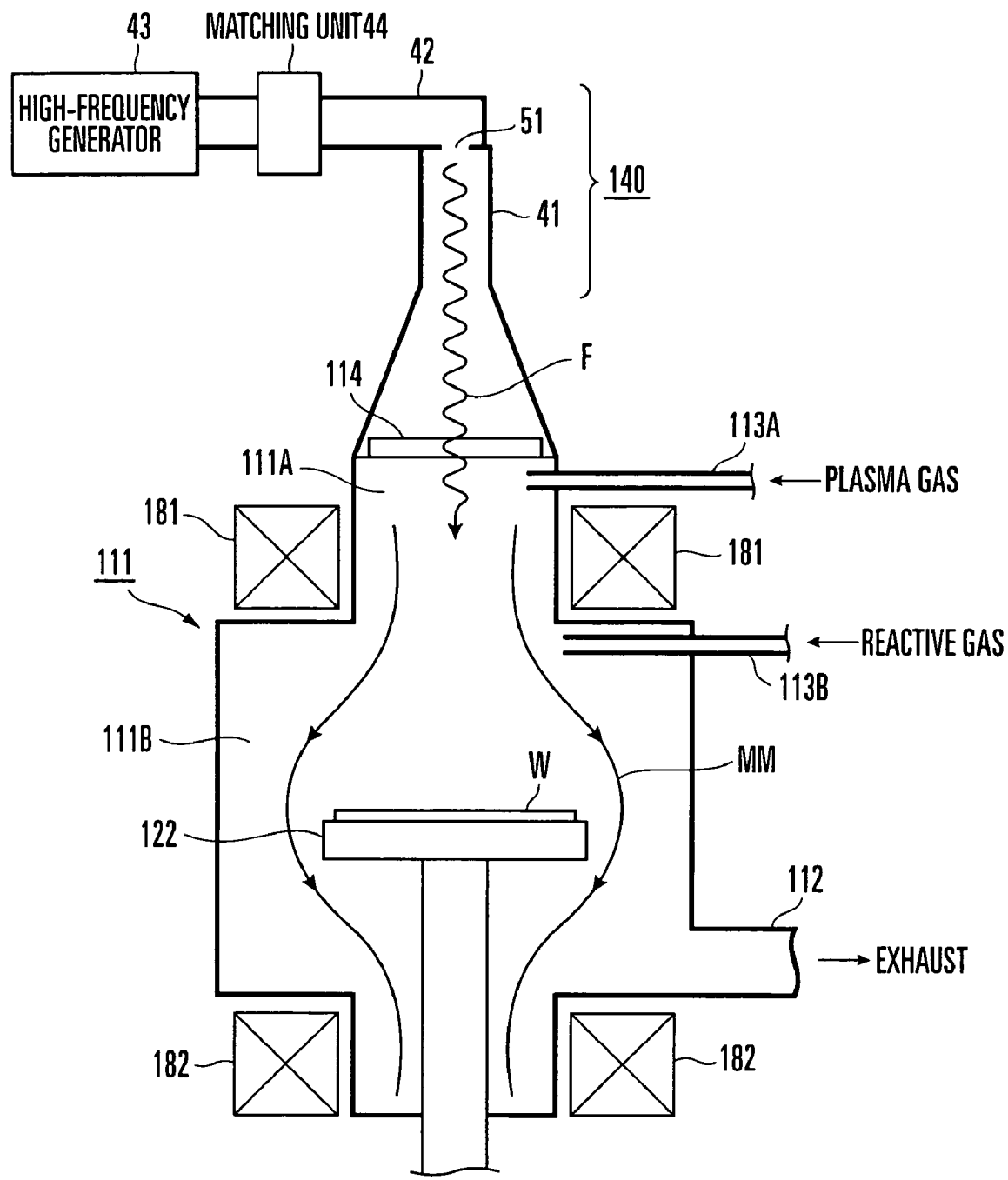
FIG. 14 is a view showing an arrangement of an ECR plasma processing apparatus according to the sixth embodiment of the present invention.
Figure 15:
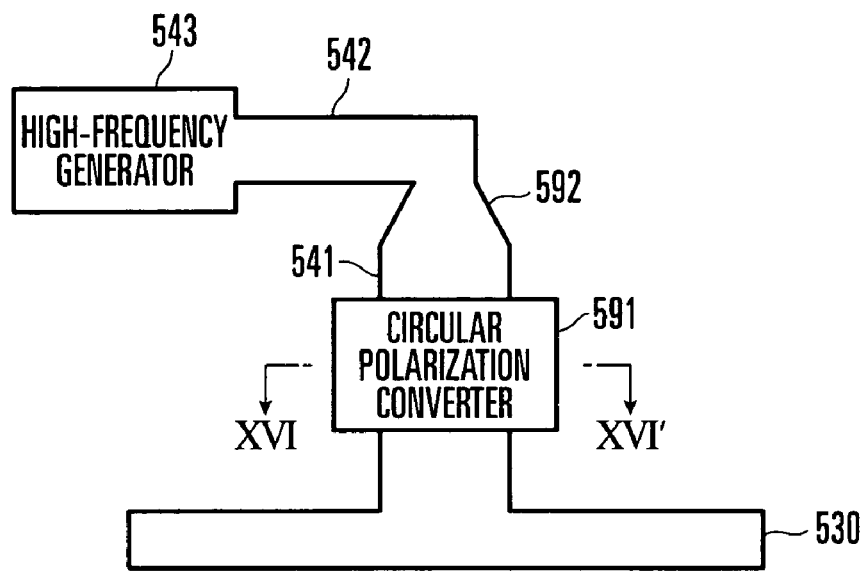
FIG. 15 is a view showing the conventional arrangement of a power feed unit for a plasma processing apparatus which employs circular polarization feeding scheme.
Figures 16A, 16B:
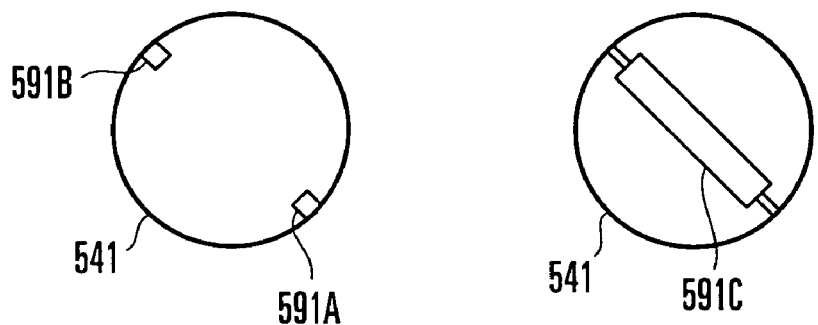
FIGS. 16A and 16B are views showing arrangements of a circular polarization converter.

The present invention can be applied not only to the high-frequency plasma processing apparatus described above but also to an ECR plasma processing apparatus. FIG. 14 shows an arrangement of an ECR plasma processing apparatus according to the sixth embodiment of the present invention. In FIG. 14, the same or identical portions as in FIGS. 1, 2A, and 2B are denoted by the same reference numerals, and a description thereof will be omitted when appropriate.

The ECR plasma processing apparatus shown in FIG. 14 has a processing vessel 111 including a plasma chamber 111A where a plasma is generated and a reaction chamber 111B where a process such as plasma CVD is performed.

A main electromagnetic coil 181 is arranged around the plasma chamber 111A to form a magnetic field with a magnetic flux density B of 87.5 mT in the plasma chamber 111A. A power feed unit 140 is connected to the upper end of the plasma chamber 111A through a dielectric plate 114. The power feed unit 140 supplies a high-frequency electromagnetic field F with a frequency equal to 2.45 GHz, which is the electron cyclotron frequency (the frequency with which electrons in the plasma rotate about the lines of magnetic force as the centers).

The reaction chamber 111B which communicates with the plasma chamber 111A accommodates a table 122 for placing a substrate (target object) W such as a semiconductor or LCD on its upper surface. An auxiliary electromagnetic coil 182 is arranged under the bottom surface of the reaction chamber 111B. A magnetic field generator including the main electromagnetic coil 181 and auxiliary electromagnetic coil 182 generates a mirror field MM in the reaction chamber 111B.

A nozzle 113A which supplies a plasma gas such as $N_2$ is arranged in the upper portion of the plasma chamber 111A, and a nozzle 113B which supplies a reactive gas such as $SiH_4$ is arranged in the upper portion of the reaction chamber 111B. An exhaust port 112 which communicates with a vacuum pump is formed in the lower portion of the reaction chamber 111B.

With this arrangement, when a magnetic field with a magnetic flux density B of 87.5 mT is formed in the plasma chamber 111A and a high-frequency electromagnetic field F with a frequency of 2.45 GHz is introduced into the plasma chamber 111A, electron-cyclotron-resonance occurs. The energy of the high-frequency electromagnetic field F shifts to the electrons efficiently to heat the electrons. With the electrons heated by the high-frequency electromagnetic field F in this manner, ionization of $N_2$ in the plasma chamber 111A continues to generate a plasma.

The power feed unit 140 has the same arrangement as that of the power feed unit 40 shown in FIG. 1. More specifically, the power feed unit 140 has a high-frequency generator 43 which generates a high-frequency electromagnetic field, a rectangular waveguide 42 with one end connected to the high-frequency generator 43 and the other end closed, a cylindrical waveguide 41 with one end connected to the other end of the rectangular waveguide 42 through a cross slot 51 and the other end connected to the upper end of the plasma chamber 111A through the dielectric plate 114, and a load matching unit 44 provided to the rectangular waveguide 42. As the power feed unit 140, the power feed unit shown in FIG. 3, 7, or 9 can be used.

These power feed units can supply a high-frequency electromagnetic field into the cylindrical waveguide 41 as a rotating electromagnetic field. The circular polarization converter 591 conventionally used to convert the high-frequency electromagnetic field in the cylindrical waveguide 541 into a rotating electromagnetic field becomes unnecessary. Therefore, problems caused by the circular polarization converter 591 can be solved. The operation of generating a plasma by performing circular polarization feeding can be stabilized. Also, a continuous operation for a long period of time is enabled.

Not only the circular polarization converter 591 but also the rectangular cylindrical converter 592 becomes unnecessary. Thus, the number of components can be decreased, and the manufacturing cost of the plasma processing apparatus can be decreased.

INDUSTRIAL APPLICABILITY

The plasma processing apparatus according to the present invention can be utilized as an etching apparatus, CVD apparatus, ashing apparatus, or the like.

The invention claimed is:

1. A plasma processing apparatus comprising:
a pedestal on which a substrate is to be placed;
a process chamber where said pedestal is to be accommodated;
a power feed unit to supply a 2.45-GHz high-frequency electromagnetic field, wherein said power feed unit has:
a cylindrical waveguide which conducts the high-frequency electromagnetic field;
a waveguide having one surface connected to one end of said cylindrical waveguide
and where the one surface of the waveguide includes a circular polarization antenna which is arranged at a first end of said cylindrical waveguide, and introduces into said cylindrical waveguide the high-frequency electromagnetic field as a rotating electromagnetic field which rotates in a plane perpendicular to a traveling direction of the high-frequency electromagnetic field and where the circular polarization antenna includes two slots which have different lengths and intersect each other at centers thereof whose frequency characteristics with respect to 2.45 GHz relatively differ by 55° to 70° and which emit electric fields whose amplitudes are equal; and
a radial waveguide which is interposed between said cylindrical waveguide and the process chamber and has two opposing surfaces, wherein a second end of said cylindrical waveguide is open to one of the two opposing surfaces, a slot antenna
formed in the other one of the two surfaces, and the radial waveguide supplies the high-frequency electromagnetic field introduced from said cylindrical waveguide into said process chamber through said slot antenna.

2. A plasma processing apparatus according to claim 1, wherein:
said waveguide is a rectangular waveguide having one side surface connected to one end of said cylindrical waveguide, and
said slots are formed in one side surface of said rectangular waveguide and open to an interior of said cylindrical waveguide.

3. A plasma processing apparatus according to claim 2, wherein one side surface of said rectangular waveguide is an E-surface.

4. A plasma processing apparatus according to claim 2, wherein said slot includes two slots which are arranged away from each other and extend in directions substantially perpendicular to each other.

5. A plasma processing apparatus according to claim 2, wherein the center of said circular polarization antenna is arranged at a position away from the terminal end of said rectangular waveguide by $\lambda g/2$ where $\lambda g$ is the tube wavelength in said rectangular waveguide.

6. A plasma processing apparatus according to claim 1, wherein:
said power feed unit further has a rectangular waveguide having a terminal end face connected to one end of said cylindrical waveguide, and
said circular polarization antenna includes at least one slot which open to an interior of said the cylindrical waveguide in the terminal end face of said rectangular waveguide.

7. plasma processing apparatus according to claim 6, wherein said slot includes two slots which have different lengths and intersect each other at centers thereof.

8. A plasma processing apparatus according to claim 6, wherein said slot includes two slots which are arranged away from each other and extend in directions substantially perpendicular to each other.

9. A plasma processing apparatus according to claim 1, wherein:
said power feed unit further has at least one coaxial waveguide which includes an inner conductor and an outer conductor disposed around said inner conductor coaxially, and which supplies the high-frequency electromagnetic field to said circular polarization antenna, and
said circular polarization antenna is a patch antenna having a first conductor plate which closes one end of said cylindrical waveguide and is connected to said outer conductor of said coaxial waveguide, and a second conductor plate which opposes said first conductor plate to be separate therefrom in said cylindrical waveguide and is connected to said inner conductor of said coaxial wave guide.

10. A plasma processing apparatus according to claim 1, wherein said slot antenna includes a plurality of cross slots each having two different-length slots that intersect each other at centers thereof.

11. A plasma processing apparatus according to claim 1, further comprising a bump which is arranged on the other one of the two surfaces in said waveguide and projects toward said cylindrical waveguide that opens in one of the two surfaces.

12. A plasma processing apparatus according to claim 1, wherein said circular polarization antenna introduces into said cylindrical waveguide a $TE_{11}$-mode rotating electromagnetic field.

* * * * *